(12) United States Patent
Cheng

(10) Patent No.: US 9,852,917 B2
(45) Date of Patent: Dec. 26, 2017

(54) METHODS OF FABRICATING SEMICONDUCTOR FINS BY DOUBLE SIDEWALL IMAGE TRANSFER PATTERNING THROUGH LOCALIZED OXIDATION ENHANCEMENT OF SACRIFICIAL MANDREL SIDEWALLS

(71) Applicant: INTERNATIONAL BUSINESS MACHINES CORPORATION, Armonk, NY (US)

(72) Inventor: Kangguo Cheng, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/077,538

(22) Filed: Mar. 22, 2016

(65) Prior Publication Data
US 2017/0278715 A1    Sep. 28, 2017

(51) Int. Cl.
| | |
|---|---|
| H01L 21/306 | (2006.01) |
| H01L 21/308 | (2006.01) |
| H01L 29/66 | (2006.01) |
| H01L 21/425 | (2006.01) |
| H01L 21/3065 | (2006.01) |
| H01L 29/78 | (2006.01) |

(52) U.S. Cl.
CPC ...... *H01L 21/3088* (2013.01); *H01L 21/3065* (2013.01); *H01L 21/3081* (2013.01); *H01L 21/3085* (2013.01); *H01L 21/3086* (2013.01); *H01L 29/66818* (2013.01); *H01L 29/7851* (2013.01)

(58) Field of Classification Search
None
See application file for complete search history.

(56) References Cited

U.S. PATENT DOCUMENTS

| | | | | |
|---|---|---|---|---|
| 6,875,703 B1 * | 4/2005 | Furukawa | ........... | H01L 21/0337 257/E21.038 |
| 7,763,531 B2 * | 7/2010 | Abadeer | ................ | B07C 5/344 257/E21.421 |
| 7,807,575 B2 * | 10/2010 | Zhou | .................. | H01L 21/3088 257/797 |
| 8,105,901 B2 * | 1/2012 | Cheng | ................ | H01L 21/2236 257/401 |
| 8,431,329 B2 * | 4/2013 | Bae | ...................... | G03F 7/0035 430/270.1 |
| 8,455,364 B2 | 6/2013 | Kanakasabapathy | | |

(Continued)

*Primary Examiner* — Marc Armand
*Assistant Examiner* — Younes Boulghassoul
(74) *Attorney, Agent, or Firm* — Tutunjian & Bitetto, P.C.; Vazken Alexanian

(57) ABSTRACT

A method of fabricating semiconductor fins, including, patterning a film stack to produce one or more sacrificial mandrels having sidewalls, exposing the sidewall on one side of the one or more sacrificial mandrels to an ion beam to make the exposed sidewall more susceptible to oxidation, oxidizing the opposite sidewalls of the one or more sacrificial mandrels to form a plurality of oxide pillars, removing the one or more sacrificial mandrels, forming spacers on opposite sides of each of the plurality of oxide pillars to produce a spacer pattern, removing the plurality of oxide pillars, and transferring the spacer pattern to the substrate to produce a plurality of fins.

16 Claims, 10 Drawing Sheets

(56) References Cited

U.S. PATENT DOCUMENTS

| | | | |
|---|---|---|---|
| 8,669,167 B1 | 3/2014 | Chang et al. | |
| 8,822,320 B2 * | 9/2014 | Cheng | H01L 21/3086 |
| | | | 257/288 |
| 8,889,561 B2 * | 11/2014 | Woo | H01L 21/3086 |
| | | | 257/401 |
| 9,105,510 B2 | 8/2015 | Woo et al. | |
| 2015/0170927 A1 | 6/2015 | Cheng et al. | |
| 2015/0311085 A1 | 10/2015 | Kozarsky et al. | |
| 2016/0005596 A1 * | 1/2016 | Behera | H01L 21/02115 |
| | | | 438/703 |

* cited by examiner

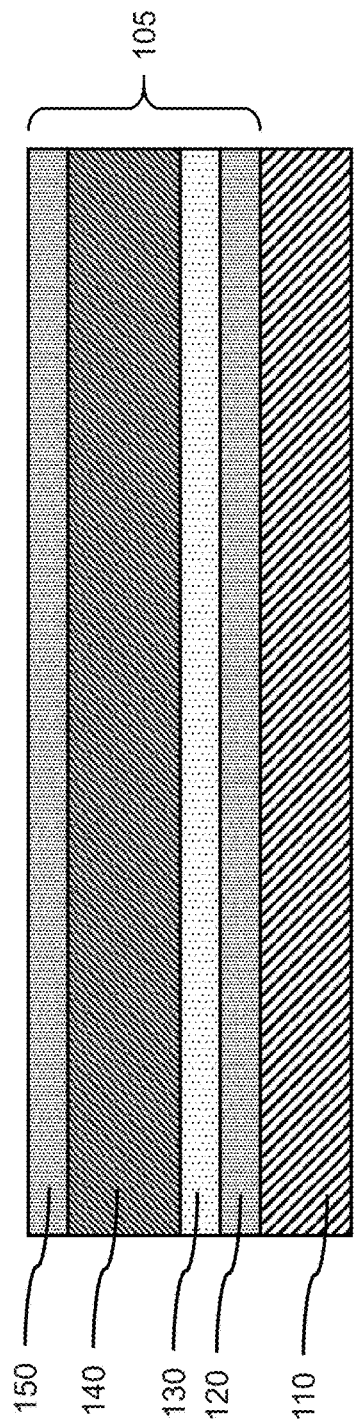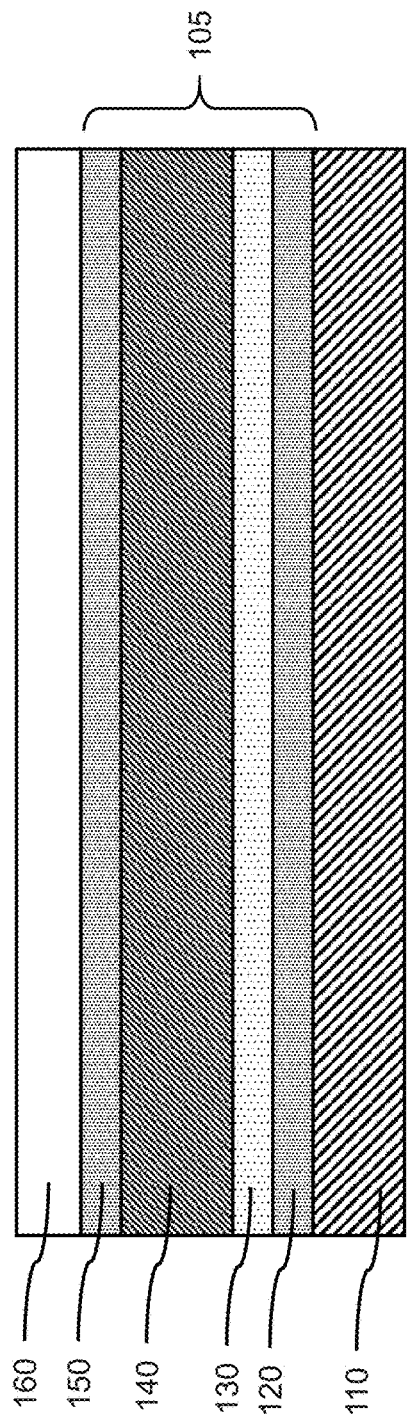

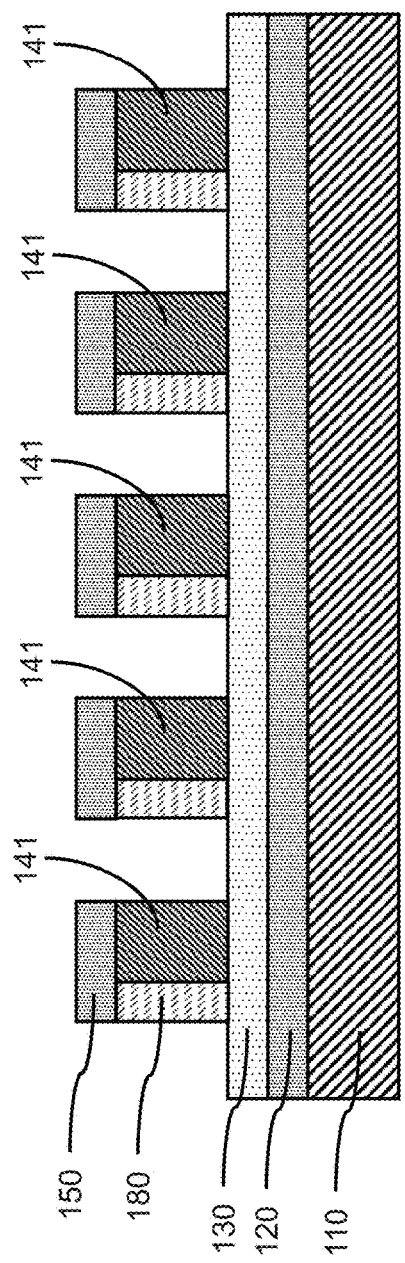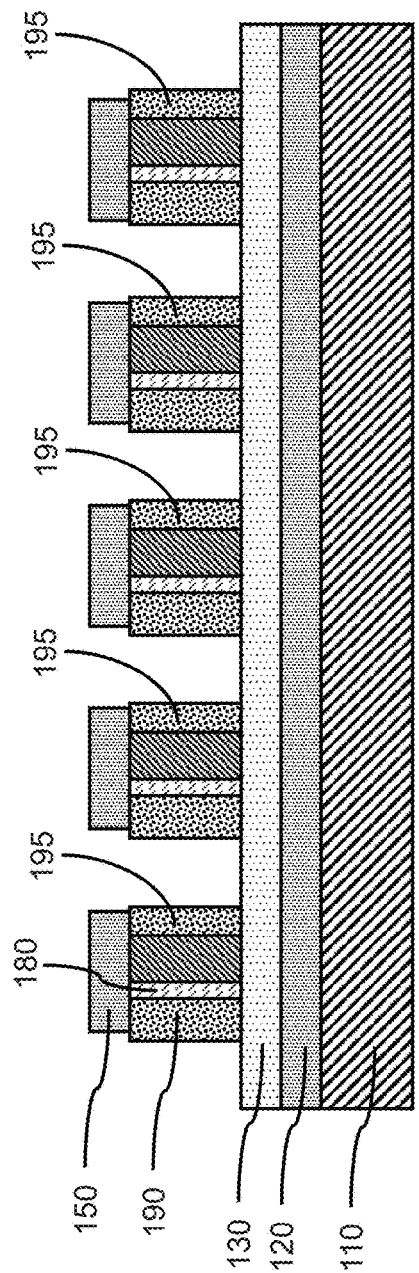

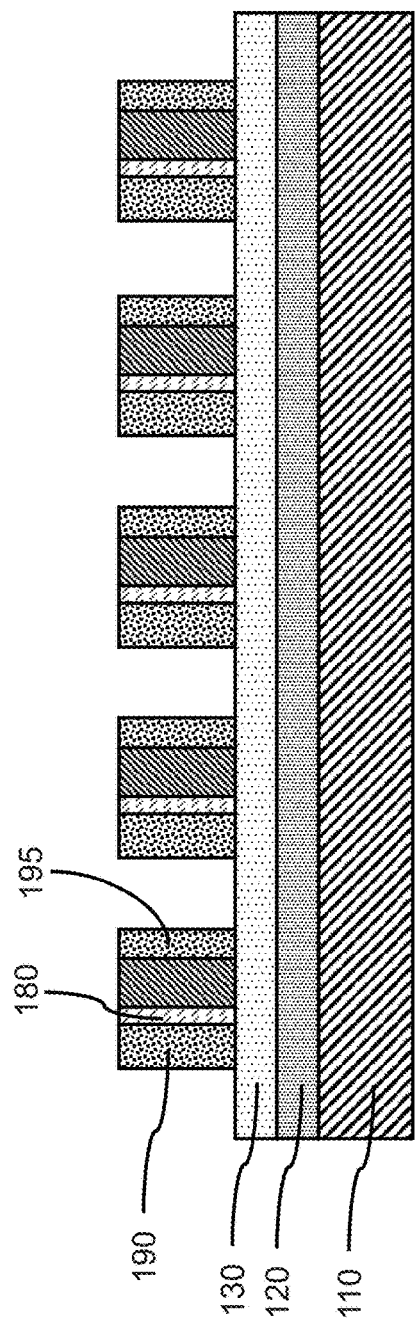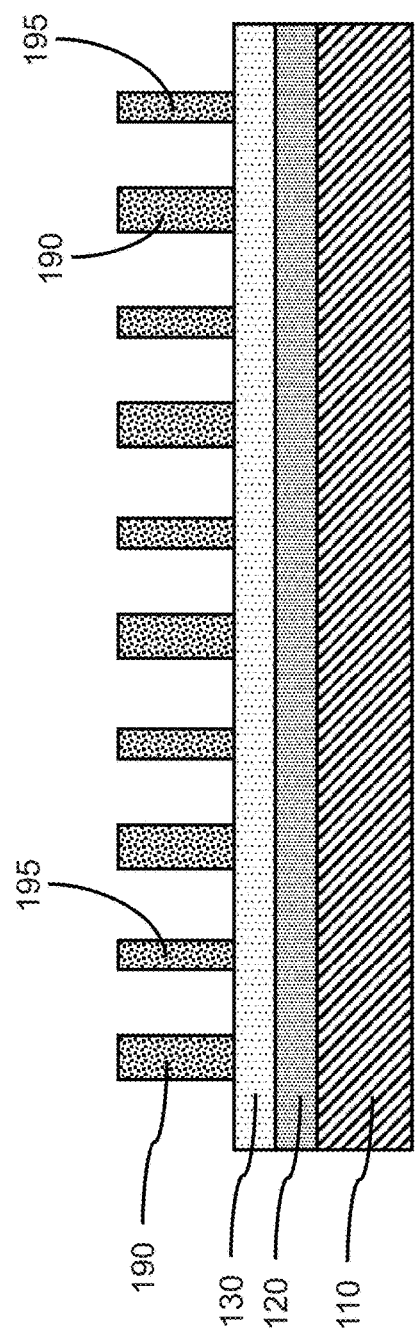
FIG. 7
FIG. 8

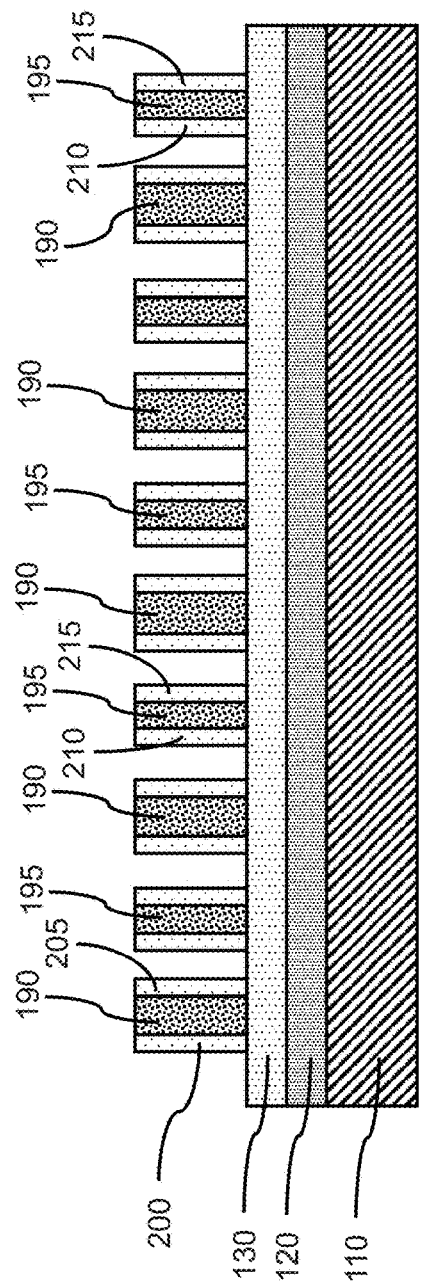

METHODS OF FABRICATING SEMICONDUCTOR FINS BY DOUBLE SIDEWALL IMAGE TRANSFER PATTERNING THROUGH LOCALIZED OXIDATION ENHANCEMENT OF SACRIFICIAL MANDREL SIDEWALLS

BACKGROUND

Technical Field

The present invention relates to the fabrication of fins having variable pitch using spacers, and more particularly to a double sidewall image transfer technique involving variable width columns.

Description of the Related Art

A Field Effect Transistor (FET) typically has a source, a channel, and a drain, where current flows from the source to the drain, and a gate that controls the flow of current through the channel. Field Effect Transistors (FETs) can have a variety of different structures, for example, FETs have been formed with the source, channel, and drain formed in the substrate material itself, where the current flows horizontally (i.e., in the plane of the substrate), and FinFETs have been formed with the channel extending outward from the substrate, but where the current also flows horizontally. The channel for the FinFET can be an upright slab of thin rectangular Si, commonly referred to as the fin with a gate on the fin, as compared to a MOSFET with a single planar gate. Depending on the doping of the source and drain, an n-FET or a p-FET may be formed.

Examples of FETs can include a metal-oxide-semiconductor field effect transistor (MOSFET) and an insulated-gate field-effect transistor (IGFET). Two FETs also may be coupled to form a complementary metal oxide semiconductor (CMOS), where a p-channel MOSFET and n-channel MOSFET are connected in series.

With ever decreasing device dimensions, forming the individual components and electrical contacts become more difficult. An approach is therefore needed that retains the positive aspects of traditional FET structures, while overcoming the scaling issues created by forming smaller device components.

SUMMARY

A method of fabricating semiconductor fins, including, patterning a film stack to produce one or more sacrificial mandrels having sidewalls, exposing the sidewall on one side of the one or more sacrificial mandrels to an ion beam to make the exposed sidewall more susceptible to oxidation, oxidizing the opposite sidewalls of the one or more sacrificial mandrels to form a plurality of oxide pillars, removing the one or more sacrificial mandrels, forming spacers on opposite sides of each of the plurality of oxide pillars to produce a spacer pattern, removing the plurality of oxide pillars, and transferring the spacer pattern to the substrate to produce a plurality of fins.

A method of fabricating semiconductor fins, including, forming a film stack on a substrate, where the film stack includes a nitride layer on the substrate, an oxide layer, a sacrificial mandrel layer, and a capping layer; patterning the capping layer and sacrificial mandrel layer to produce one or more sacrificial mandrels having sidewalls; exposing the sidewall on one side of the one or more sacrificial mandrels to an ion beam to make the exposed sidewall more susceptible to oxidation; oxidizing the sidewalls of the one or more sacrificial mandrels to form a plurality of oxide pillars; removing the one or more sacrificial mandrels; forming spacers on opposite sides of each of the plurality of oxide pillars to produce a spacer pattern; removing the plurality of oxide pillars; and transferring the spacer pattern to the substrate by etching the oxide layer, nitride layer and substrate.

An intermediate FinFET structure, including, a semiconductor substrate, a nitride layer on the semiconductor substrate, an oxide layer on the nitride layer, a sacrificial mandrel on the nitride layer, wherein the sacrificial mandrel has a width in the range of about 20 nm to about 400 nm, and a first oxide pillar on a first side of the sacrificial mandrel and a second oxide pillar on the opposite side of the sacrificial mandrel, wherein the first oxide pillar has a width in the range of about 15 nm to about 60 nm, and the second oxide pillar has a width in the range of about 10 nm to about 30 nm.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein:

FIG. 1 is a cross-sectional side view of a film stack on a substrate in accordance with an exemplary embodiments;

FIG. 2 is a cross-sectional side view of a substrate and film stack in accordance with an exemplary embodiment;

FIG. 5 is a cross-sectional side view of a substrate and preferentially doped sacrificial mandrels in accordance with an exemplary embodiment;

FIG. 6 is a cross-sectional side view of a substrate, sacrificial mandrels, and oxide pillars in accordance with an exemplary embodiment;

FIG. 7 is a cross-sectional side view of a substrate, sacrificial mandrels, and oxide pillars in accordance with an exemplary embodiment;

FIG. 8 is a cross-sectional side view of a substrate and oxide pillars in accordance with an exemplary embodiment;

FIG. 9 is a cross-sectional side view of a substrate, oxide pillars, and spacers in accordance with an exemplary embodiment;

FIG. 10 is a cross-sectional side view of a substrate and free-standing vertical spacers in accordance with an exemplary embodiment;

DETAILED DESCRIPTION

Figure 3:
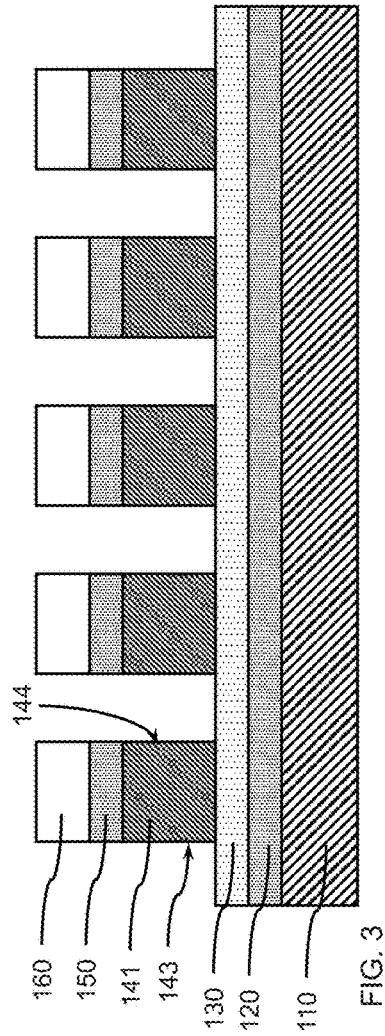
FIG. 3 is a cross-sectional side view of a patterned and etched film stack 105 in accordance with an exemplary embodiment.

Principles and embodiments of the present disclosure relate to methods of fabricating vertical fins for FinFET devices, and to approaches of forming more closely spaced fins having variable pitch. Sidewall image transfer (SIT) involves a sacrificial mandrel that is formed, and the formation of spacers adjacent to the mandrels, where the width (i.e., thickness) of the spacers is less than the width possible through direct lithographic techniques. Instead, the width of the spacer(s) is controlled through chemical processes, such as the rate of oxidation of the mandrel material, or conformal sidewall depositions by ALD/CVD, where the reaction rate and/or spatial resolution is finer than lithographic resolution.

Further FinFET scaling involves finer control over the pitch between fins. Reduction in the width (i.e., thickness) of the fins and the size of the gaps between such fins may be accomplished by performing sidewall image transfer twice, which will be referred to a double SIT patterning ($SIT^2$). A fin pitch (the distance from a first side surface of a fin to the same side surface of a neighboring fin) below 40 nm may be achieved using $SIT^2$. In one or more embodiments of a $SIT^2$ process, the sidewall spacers remaining after a first SIT process can be used as the sacrificial mandrels of a second SIT process. Variable mandrels for the second SIT process may be formed through the first SIT process by implementation of variable oxidation rates on opposite sides of a first sacrificial mandrel. The oxidation rate of the sacrificial mandrel material may be influenced by the type and/or degree of doping.

In the formation of SRAM including n-doped and p-doped CMOS, achieving the fin spacing can involve the removal of dummy fins; however, in the dense fin patterns, completely removing a dummy fin without damaging adjacent fins can be extremely challenging.

In various embodiments, a dense fin pattern produced by the $SIT^2$ process may be fabricated with controlled gaps; thereby, avoiding the formation and removal of dummy fins. An SRAM may be formed without dummy fin removal.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Referring now to the drawings in which like numerals represent the same or similar elements and initially to FIG. 1, which is a cross-sectional side view of a film stack on a substrate in accordance with an exemplary embodiments.

In one or more embodiments, a film stack 105 including a plurality of layers on a substrate 110 may be used to form a plurality of mandrels on the substrate 110. In various embodiments, the substrate 110 may be a semiconductor substrate, for example silicon, silicon germanium, germanium, and/or compound semiconductors, including, III-V compound semiconductors and II-VI compound semiconductors. In various embodiments, the film stack 105 may include a nitride layer 120, an oxide layer 130, a sacrificial mandrel layer 140, and a capping layer 150. In various embodiments, additional layers may be included, different layers may be substituted, and/or some layers may be eliminated depending on the processing steps, etching selectivity, use of etch stop layers, specific material selections, etc., as would be known in the art.

In one or more embodiments, the film stack 105 may be deposited using known deposition methods, including but not limited to chemical vapor deposition (CVD), physical vapor deposition, (PVD), and atomic layer deposition (ALD), as well as variations and modifications thereof (e.g., plasma enhanced, low pressure, metal organic, etc.).

In various embodiments, a nitride layer 120 may be formed on the substrate, where the nitride layer may be silicon nitride (e.g., $Si_3N_4$). An oxide layer 130 may be formed on the nitride layer 120, where the oxide layer may be silicon oxide (e.g., $SiO_2$). A sacrificial mandrel layer 140 may be formed on the oxide layer 130, where the sacrificial mandrel layer 140 may be an undoped amorphous silicon layer (a-Si) or a polycrystalline silicon layer. A capping layer 150 may be formed on the sacrificial mandrel layer 140, where the capping layer 150 may be a nitride material, for example, silicon nitride (e.g., $Si_3N_4$). The different materials may act as etch stops for processing features in various layers.

In one or more embodiments, the various layers may be processed using known etching techniques, including but not limited to reactive ion etching (RIE), plasma etching, and wet chemical etching, as well as variations and modifications thereof (e.g., ashing, plasma oxidation, etc.).

FIG. 2 is a cross-sectional side view of a substrate and film stack in accordance with an exemplary embodiment.

In one or more embodiments, a resist 160 may be formed on the film stack 105, where the resist 160 may be a photoresist formed on the exposed surface of the capping layer 150. In various embodiments, the resist may be a positive or negative resist material that can be patterned and developed by exposure to electron beams and/or photons (e.g., e-beams, X-rays, UV light, visible light, etc.). The resist may include a polymeric material or hydrogen silsesquioxane (HSQ).

In various embodiments, the resist 160 may be patterned and developed to form openings exposing the underlying capping layer 150, where the resist 160 protects portions of the film stack 105 during reactive ion etching (RIE) of the capping layer 150.

FIG. 3 is a cross-sectional side view of a patterned and etched film stack 105 in accordance with an exemplary embodiment.

In one or more embodiments, the capping layer 150 and underlying sacrificial mandrel layer 140 may be patterned by etching the capping layer 150 and sacrificial mandrel layer 140 exposed by developing the resist. Portions of the capping layer 150 and underlying sacrificial mandrel layer 140 may be removed to expose the underlying oxide layer 130, where the capping layer 150 and underlying sacrificial mandrel layer 140 may be removed by RIE or plasma etching. The RIE may provide essentially vertical sidewalls exposing side surfaces of the capping layer 150 and underlying sacrificial mandrel layer 140 to produce one or more sacrificial mandrels 141 having sidewalls 143, 144.

In various embodiments, the sacrificial mandrels 141 may be patterned to have the same pitch, or may have a variable pitch depending on the resist patterning. The sacrificial mandrels 141 may have the same widths or different widths depending on the resist patterning. In various embodiments, the sacrificial mandrels 141 may have a width in the range of about 20 nm to about 400 nm, or in the range of about 40 nm to about 400 nm, or in the range of about 20 nm to about 100 nm, or in the range of about 40 nm to about 100 nm.

Figure 4:
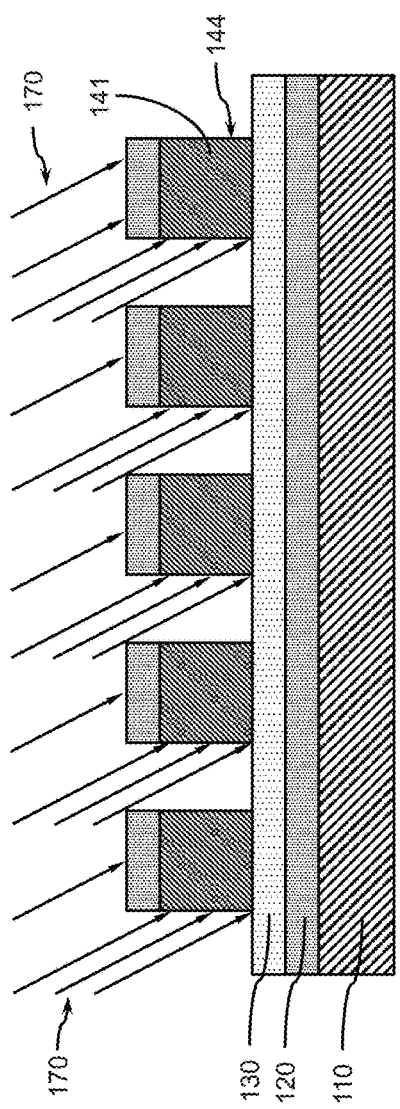
FIG. 4 is a cross-sectional side view of a substrate and film stack exposed to an ion beam in accordance with an exemplary embodiment.

FIG. 4 is a cross-sectional side view of a substrate and film stack exposed to an ion beam in accordance with an exemplary embodiment.

In one or more embodiments, the sidewalls 143 of a sacrificial mandrels 141 may be exposed to an ion beam 170, where the ion beam may chemically alter at least one exposed sidewall 143 on one side of the sacrificial mandrels 141 to make the exposed sidewall more susceptible to oxidation. The ion beam 170 may include chemical species that can alter the material of the sacrificial mandrels 141 to be more susceptible to oxidation. In various embodiments, the ion beam 170 may be a p-type dopant (e.g., boron), that makes silicon more susceptible to oxidation. In various embodiments, the ion beam 170 may be an n-type dopant (e.g., phosphorous and/or arsenic), that makes silicon more susceptible to oxidation.

In one or more embodiments, the ion bombardment of the sacrificial mandrels 141 is done at an angle, such that one sidewall 144 of the sacrificial mandrels 141 is shadowed by the mandrel 141 and capping layer 150, while the other sidewall 143 is impinged by the ion beam 170. The ion implantation energy, ion beam density, and chemical species and associated mass of the implanted ion may be selected to control the depth of implantation and subsequent dopant concentration in the sacrificial mandrel(s) 141. The implantation profile may be controlled to obtain a surface implantation of the dopant to a predetermined depth. A subsequent oxidation process may convert at least the most heavily-doped portions of the sacrificial mandrel(s) 141 into an oxide pillar, where the oxidation may occur faster at the heavily-doped side than the less-doped or undoped side of the sacrificial mandrel(s) 141. In various embodiments, the surface portions of the sacrificial mandrel(s) 141 may be converted into oxide pillars by thermal oxidation of the amorphous or polycrystalline silicon.

FIG. 5 is a cross-sectional side view of a substrate and preferentially doped sacrificial mandrels in accordance with an exemplary embodiment.

In one or more embodiments, a portion of the sacrificial mandrel(s) 141 is chemically modified by the ion implantation to form a doped portion 180 of sacrificial mandrel(s) 141.

FIG. 6 is a cross-sectional side view of a substrate, sacrificial mandrels, and oxide pillars in accordance with an exemplary embodiment.

In one or more embodiments, the sacrificial mandrel(s) 141 is oxidized to form oxide pillars 190, 195, where the doped portion 180 of the sacrificial mandrel(s) 141 undergoes faster and/or deeper oxidation than the undoped portion of the sacrificial mandrel(s) 141. In various embodiments, the entire sacrificial mandrel(s) 141 is exposed to an oxidizing environment to form oxide pillars 190, 195, where a wider (i.e., thicker) oxide pillar 190 is formed on the doped side of the sacrificial mandrel 141, and a narrower (i.e., thinner) oxide pillar 195 is formed on the undoped side of the sacrificial mandrel 141. The oxide pillars 190, 195 may be formed on opposite sides of the sacrificial mandrel 141, where a portion of the mandrel material is used to form the oxide pillars. In various embodiments, the oxide pillars 190, 195 may have a width in the range of about 10 nm to about 60, or in the range of about 15 nm to about 60 nm, or in the range of about 10 nm to about 30 nm, or in the range of about 15 nm to about 30 nm. In various embodiments, the wider oxide pillar 190 (which may also be referred to as a first oxide pillar) has a width in the range of about 15 nm to about 60 nm, and the narrower oxide pillar 195 (which may also be referred to as a second oxide pillar) may have a width in the range of about 10 nm to about 30 nm, where the width of the narrower oxide pillar 195 may be less than the width of the wider oxide pillar 190.

A plurality of oxide pillars 190, 195 may be formed from one or more sacrificial mandrel(s) 141. In various embodiments, not all of the doped portion 180 may be used to form the wider oxide pillar 190, a portion of the doped mandrel may remain after oxidation. The thicker oxide pillar 190 may extend laterally out from the capping layer 150 due to changes in material density and crystal structure from implantation and oxidation.

In one or more embodiments, an amorphous silicon sacrificial mandrel 141 may be oxidized to form silicon oxide (e.g., $SiO_2$) pillars 190, 195.

FIG. 7 is a cross-sectional side view of a substrate, sacrificial mandrels, and oxide pillars in accordance with an exemplary embodiment.

In one or more embodiments, the capping layer 150 may be removed to expose the top surfaces of the oxide pillars 190, 195, and the doped portion 180 and undoped portion of the sacrificial mandrels 141. The capping layer 150 may be removed by etching, for example, RIE, dry chemical etching, or plasma etching, such that the capping layer material is selectively etched. In various embodiments, a nitride capping layer (e.g., SiN) may be selectively removed by a fluorine containing plasma etch or RIE. The oxide layer 130 may remain substantially unetched by the selective etching of the capping layer 150.

FIG. 8 is a cross-sectional side view of a substrate and oxide pillars in accordance with an exemplary embodiment.

In one or more embodiments, subsequent to removal of the capping layer 150 and remaining portions of the sacrificial mandrels 141 may be removed, for example by etching, to leave free-standing oxide pillars 190, 195. The oxide layer 130 may remain substantially unetched by the selective etching of the sacrificial mandrels 141.

In various embodiments, removal of the sacrificial mandrels 141 may form gaps having a predetermined width between the oxide pillars 190, 195. The gap between a wide oxide pillar 190 and a narrow oxide pillar 195 formed by oxidation of the same sacrificial mandrel 141 may be based on the original width of the sacrificial mandrel 141, whereas the gap between a wide oxide pillar 190 and a narrow oxide pillar 195 of adjacent sacrificial mandrels 141 may be based on the pitch of the sacrificial mandrel 141

FIG. 9 is a cross-sectional side view of a substrate, oxide pillars, and spacers in accordance with an exemplary embodiment.

In one or more embodiments, spacers 200, 205 may be formed at least on opposite sides of the oxide pillars 190, 195, where the spacers 200, 205 may be formed by conformal deposition of the spacer material on the sidewalls of the oxide pillars 190, 195. The spacers 200, 205 may be conformally deposited, for example, by ALD, CVD, or a combination thereof. In various embodiments, the spacers 200, 205 may be made of amorphous carbon. The amorphous carbon may be deposited by CVD.

In various embodiments, the spacers 200, 205 may have a width (i.e., thickness) less than the width of the wider oxide pillar 190 and/or the narrower oxide pillar 195. In various embodiments, the spacers 200, 205 may have a width in the range of about 5 nm to about 20 nm, or in the range of about 5 nm to about 10 nm.

FIG. 10 is a cross-sectional side view of a substrate and free-standing vertical spacers in accordance with an exemplary embodiment.

In one or more embodiments, the oxide pillars 190, 195 may be removed to leave free-standing vertical spacers 200, 205, where the spacers are spatially arranged to have controlled pitches and gaps. The gap, $G_2$, between a vertical spacer 200 and vertical spacer 205 may be controlled by the width of the wider oxide pillar 190, whereas the pitch, $P_2$, between vertical spacer 200 and vertical spacer 205 may be controlled by the width of the wider oxide pillar 190 and the thickness of vertical spacer 200. The gap, $G_1$, between a vertical spacer 200 and vertical spacer 205 may be controlled by the width of the narrower oxide pillar 195, whereas the pitch, $P_1$, between vertical spacer 200 and vertical spacer 205 may be controlled by the width of the narrower oxide pillar 195 and the thickness of vertical spacer 205. The gap, $G_3$, may be controlled by adjusting the thicknesses of vertical spacers 200 and vertical spacers 205 of adjacent oxide pillars 190, 195.

In various embodiments, the oxide pillars 190, 195 and oxide layer 130 may be removed through the same etching processes to form oxide columns 131 beneath free-standing vertical spacers 200, 210 and free-standing vertical spacers 205, 215. Portions of the nitride layer 120 underlying oxide layer 130 may be partially removed to form a nitride layer 120 with different thicknesses between different vertical spacers 200, 205, 210, 215 such that the gaps between the spacers 200, 205, 210, 215 have varying depths.

Figure 11:
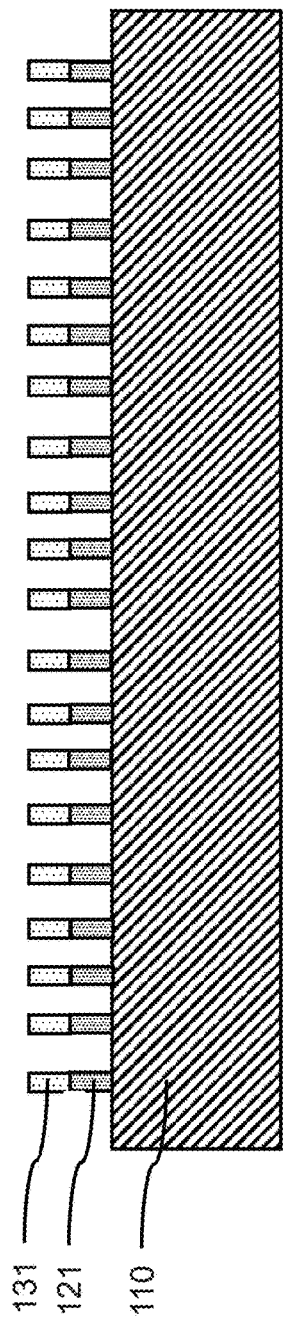
FIG. 11 is a cross-sectional side view of a substrate, oxide columns, and nitride columns in accordance with an exemplary embodiment.

FIG. 11 is a cross-sectional side view of a substrate, oxide columns, and nitride columns in accordance with an exemplary embodiment.

In one or more embodiments, free-standing vertical spacers 200, 205, 210, 215 may be removed, and the nitride layer 120 etched to the underlying substrate, to leave oxide columns 131 over nitride columns 121. In various embodiments, the oxide columns 131 and nitride columns 121 form a mask for transferring the spacer pattern into the substrate 110 to form fins 115 from the substrate 110. The fins may be made of a semiconductor material, for example, amorphous silicon.

Figure 12:
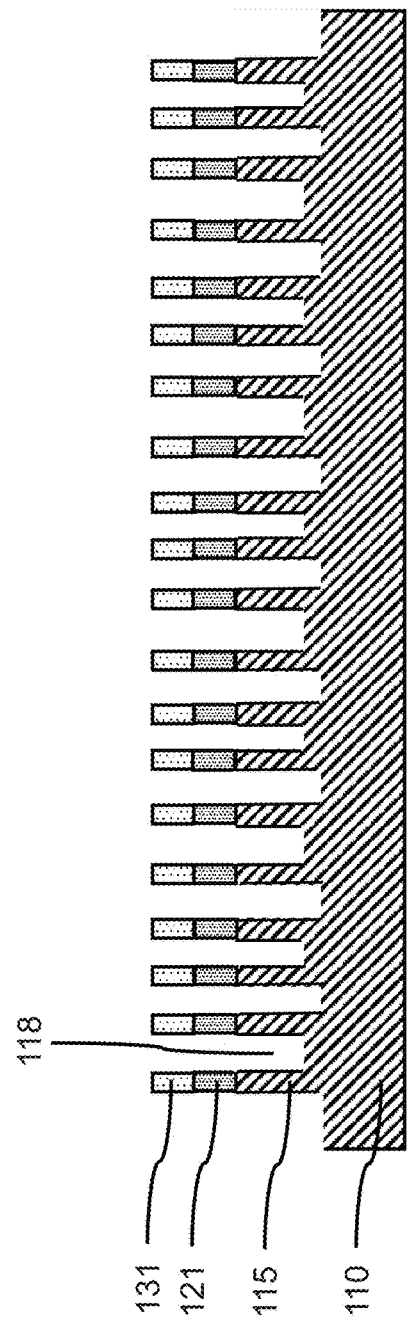
FIG. 12 is a cross-sectional side view of a substrate, oxide and nitride columns, and fins in accordance with an exemplary embodiment.

FIG. 12 is a cross-sectional side view of a substrate, oxide and nitride columns, and fins in accordance with an exemplary embodiment.

In one or more embodiments, a portion of the substrate material exposed between the columns is removed to form fins 115 separated by trenches 118. In various embodiments, the substrate material may be removed by RIE to form the vertical fins 115 for fabricating FinFETs. The sides of the fins 115 may have different heights due to differential etching resulting from different gap sizes between the adjacent columns. The fins 115 may have different pitches through control of the widths and patterning of the overlying columns 190, 195, spacers 200, 205, 210, 215, pillars 121, 131, and mandrels 141. The trenches 118 may have varying depths.

In an embodiment, a silicon substrate may be etched to form silicon fins, where the substrate may be doped to form p-type fin channels or n-type fin channels.

Figure 13:
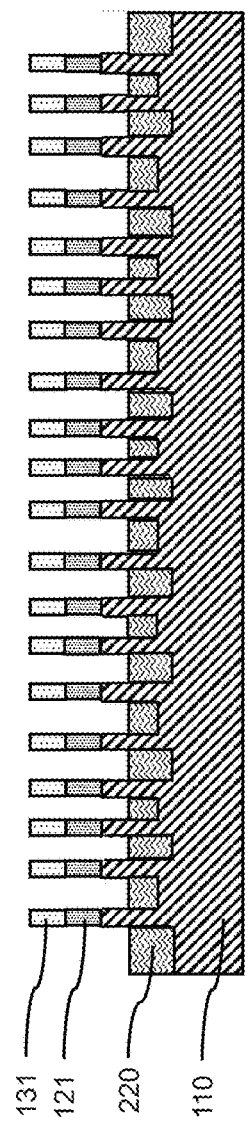
FIG. 13 is a cross-sectional side view of fins and trenches partially filled with a dielectric in accordance with an exemplary embodiment.

FIG. 13 is a cross-sectional side view of fins and trenches partially filled with a dielectric in accordance with an exemplary embodiment.

In one or more embodiments, a dielectric material 220 may be formed in the trenches 118 between the fins 115 to electrically insulate at least a portion of the fins. The dielectric fill may provide shallow trench isolation between the fins. In various embodiments, the dielectric material 220 may have varying vertical lengths, where the varying length may be due to varying depths of the trenches 118.

In various embodiments, the oxide columns 131 and nitride columns may be removed before or after depositing the dielectric material in the trenches 118. Complete FinFETs may subsequently be formed from the fins 115. The FinFETs may be used to form CMOS transistors and subsequently SRAM.

Figure 14:
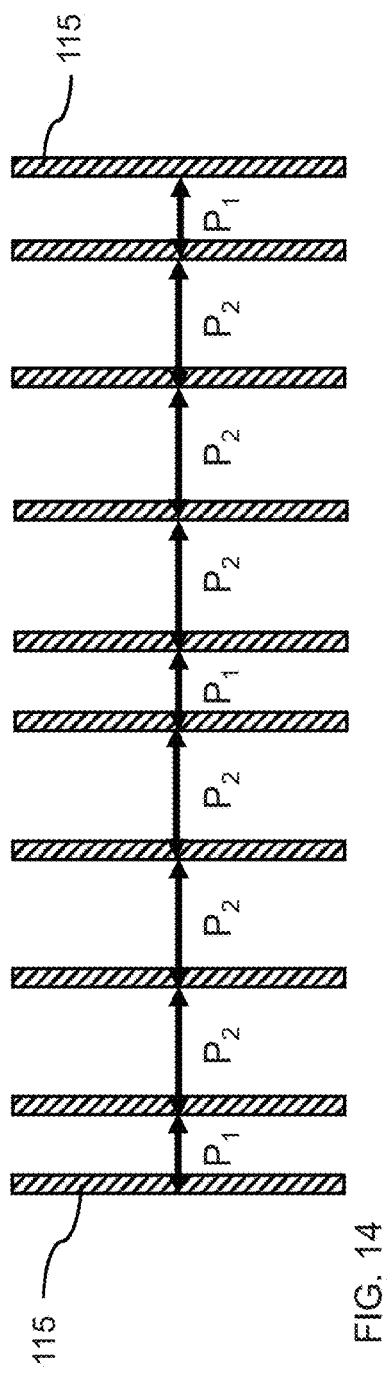
FIG. 14 is a top view of fins in a predetermined pattern in accordance with an exemplary embodiment.

FIG. 14 is a top view of fins in a predetermined pattern in accordance with an exemplary embodiment.

In various embodiments, the fins may be patterned to have a predetermined pitch, where the pitch may depend on the characteristics of the FinFET to be fabricated. By controlling the various widths of the fabricated components (mandrels, columns, spacers), an arrangement of fins 115 having pitches $P_1$ and $P_2$ may be formed, where $P_1$ and $P_2$ may be variable, such that $P_2 \neq N \times P_1$, where $P_1$, may be a minimum fin pitch, and 'N' is an integer.

Figure 15:
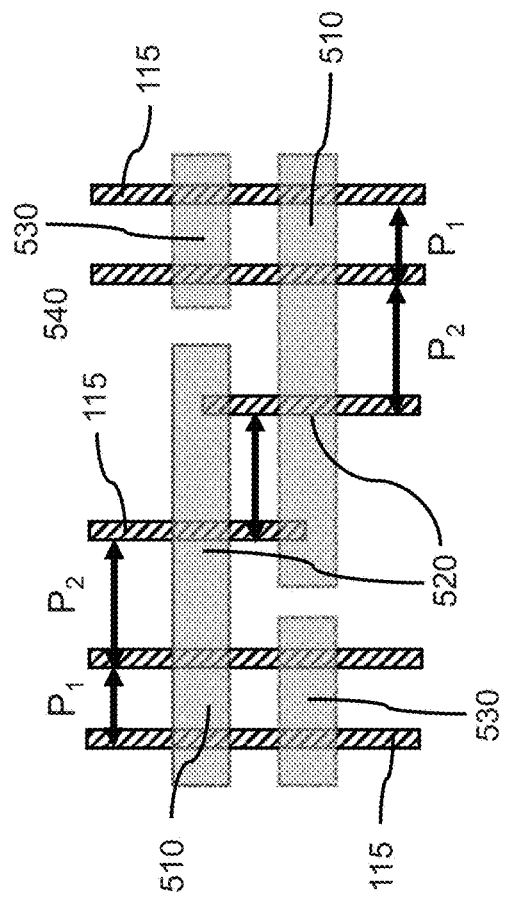
FIG. 15 is a top view of a static random access memory (SRAM) cell in accordance with an exemplary embodiment.

FIG. 15 is a top view of a static random access memory (SRAM) cell in accordance with an exemplary embodiment.

In one or more embodiments, a plurality of fins 115 may be electrically connected to form an SRAM, where each SRAM may include a pair of Pull-Down transistors 510, a pair of Pull-Up transistors 520, and a pair of Pass Gate transistors 530. Each Pull-Down transistor 510 may be an n-type transistor having two fins 115. Each Pass Gate transistor 530 may be an n-type transistor having two fins 115. Each Pull-Up transistor 520 may be a p-type transistor having a single fin 115. Each pair of Pull-Down transistors 510 and Pull-Up transistors 520 may share a common gate. Such an SRAM cell may be referred to as a "221" cell.

Figure 16:
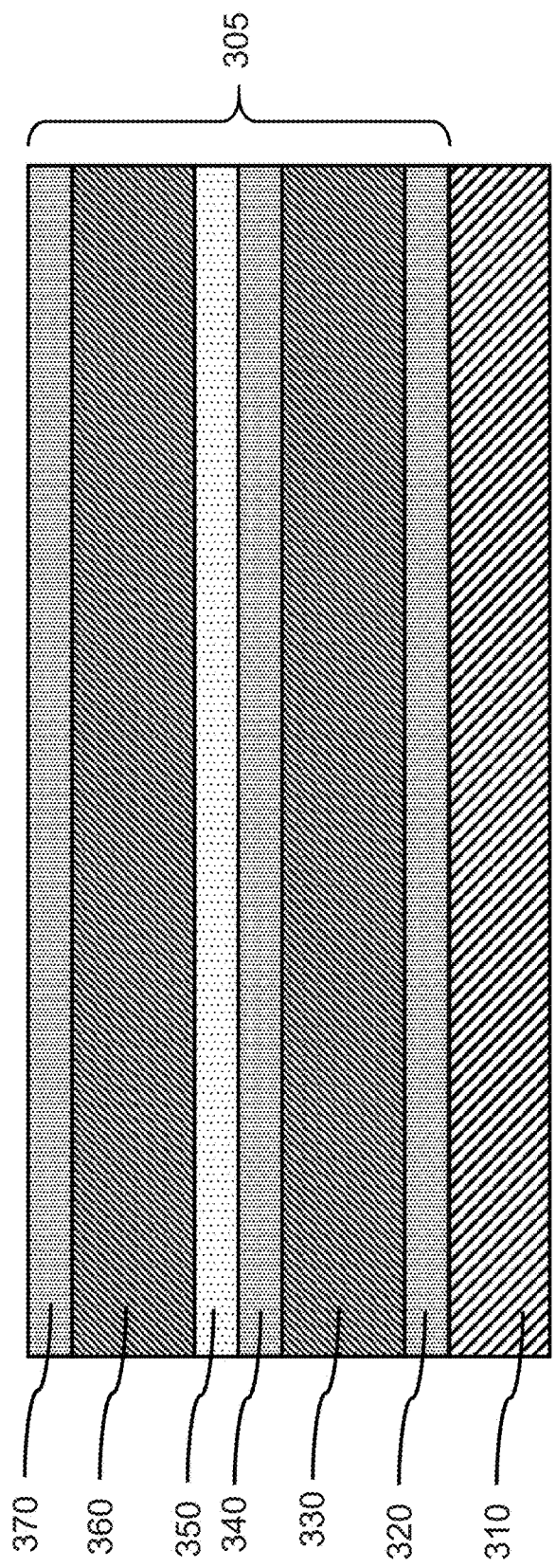
FIG. 16 is a cross-sectional side view of a film stack on a substrate in accordance with an exemplary embodiments.

FIG. 16 is a cross-sectional side view of a film stack on a substrate in accordance with an exemplary embodiments.

In one or more embodiments, a film stack 305 including a plurality of layers on a substrate 310 may be used to form a plurality of mandrels on the substrate 310. In various embodiments, the film stack 305 may include a substrate 310, a first nitride layer 320, a fin-forming layer 330, a second nitride layer 340, an oxide layer 350, a second sacrificial mandrel layer 360, and a capping layer 370.

In various embodiments, the film stack including the second nitride layer 340, the oxide layer 350, the sacrificial mandrel layer 360, and the capping layer 370 may be patterned, etched, and formed as discussed above, to form spacers, and the spacer pattern may be transferred to the fin-forming layer 330 to form fins instead of processing and transferring the pattern to the substrate 310.

Figure 17:
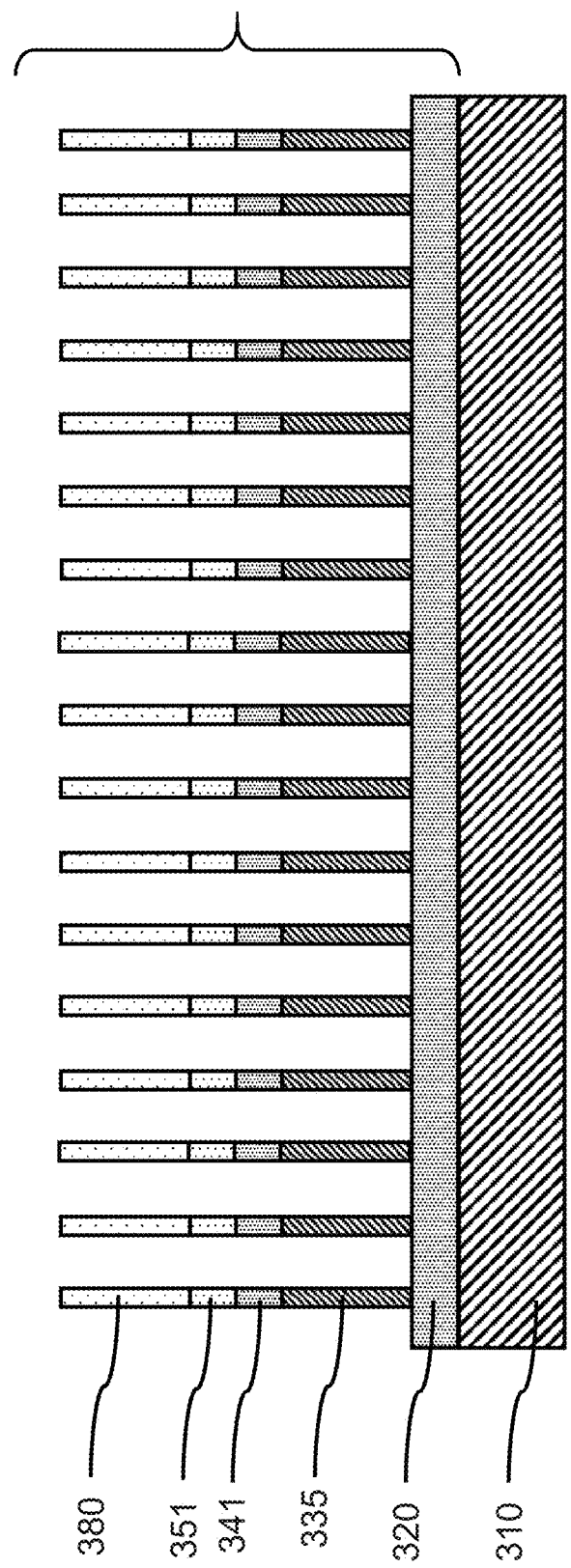
FIG. 17 is a cross-sectional side view of a substrate, spacers, oxide and nitride columns, and fins in accordance with an exemplary embodiment.

FIG. 17 is a cross-sectional side view of a substrate, spacers, oxide and nitride columns, and fins in accordance with an exemplary embodiment.

In various embodiments, the sacrificial mandrel layer 360 may be patterned, ion implanted, and oxidized to form spacers 380, that can provide the pattern to be transferred to the second nitride layer 340 and the oxide layer 350 to mask and form the fins 335 in the fin-forming layer 330, where the fin-forming layer 330 may be an amorphous silicon layer or a polycrystalline silicon layer.

Having described preferred embodiments of a system and method for fabrication of fins using variable spacers (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of fabricating semiconductor fins, comprising:
    patterning a film stack to produce one or more sacrificial mandrels having sidewalls;
    exposing the sidewall on one side of the one or more sacrificial mandrels to an ion beam to make the exposed sidewall more susceptible to oxidation;
    oxidizing the opposite sidewalls of the one or more sacrificial mandrels to form a plurality of oxide pillars;
    removing the one or more sacrificial mandrels;
    forming spacers on opposite sides of each of the plurality of oxide pillars to produce a spacer pattern;
    removing the plurality of oxide pillars;
    transferring the spacer pattern to the substrate to produce a plurality of fins by etching the substrate to form trenches between the fins having varying depths; and
    filling the trenches with a dielectric material.

2. The method of claim 1, wherein the one or more sacrificial mandrels are amorphous silicon.

3. The method of claim 1, wherein the ion beam impinges the sidewall on one side of the one or more sacrificial mandrels at an angle that shadows the opposite sidewall of the one or more sacrificial mandrels.

4. The method of claim 1, wherein the oxide pillars formed from opposite sidewalls of the one or more sacrificial mandrels have different widths.

5. The method of claim 1, wherein the fins have a predefined pitch.

6. The method of claim 1, wherein the spacers are formed by conformal deposition on at least opposite sides of each of the plurality of oxide pillars.

7. The method of claim 6, wherein the spacers are amorphous carbon.

8. The method of claim 1, wherein the sidewall on one side of the one or more sacrificial mandrels is exposed to an ion beam comprising a p-type dopant.

9. The method of claim 8, wherein the p-type dopant is boron and the sacrificial mandrels are amorphous silicon.

10. A method of fabricating semiconductor fins, comprising:
    forming a film stack on a substrate, where the film stack includes
        a nitride layer on the substrate, an oxide layer,
        a sacrificial mandrel layer,
        and a capping layer;
    patterning the capping layer and sacrificial mandrel layer to produce one or more sacrificial mandrels having sidewalls;
    exposing the sidewall on one side of the one or more sacrificial mandrels to an ion beam to make the exposed sidewall more susceptible to oxidation;
    oxidizing the sidewalls of the one or more sacrificial mandrels to form a plurality of oxide pillars;
    removing the one or more sacrificial mandrels;
    forming spacers on opposite sides of each of the plurality of oxide pillars to produce a spacer pattern;

removing the plurality of oxide pillars; and transferring the spacer pattern to the substrate by etching the oxide layer, nitride layer and substrate.

11. The method of claim 10, which further comprises etching the substrate to form trenches having varying depths.

12. The method of claim 10, wherein the sacrificial mandrels have a width in the range of about 20 nm to about 400 nm.

13. The method of claim 10, wherein the oxide pillars on an ion-exposed sidewall of the sacrificial mandrels have a width in the range of about 15 nm to about 60 nm.

14. The method of claim 10, wherein the spacers have a width in the range of about 5 nm to about 20 nm.

15. The method of claim 10, wherein the spacer pattern is transferred to the substrate to form a plurality of fins for forming FinFETs.

16. The method of claim 15, wherein the spacer pattern has a predetermined pitch, $P_1$, between two spacers and a predetermined pitch, $P_2$, between two spacers, wherein $P_2 \neq N \times P_1$, and N is an integer.

* * * * *